US012813173B2

(12) United States Patent
Lim et al.

(10) Patent No.: US 12,813,173 B2
(45) Date of Patent: Nov. 24, 2026

(54) SEMICONDUCTOR PACKAGING METHOD

(71) Applicant: JUSUNG ENGINEERING CO., LTD., Gwangju-Si (KR)

(72) Inventors: Eick Hyun Lim, Gwangju-Si (KR); Min Jong Keum, Gwangju-Si (KR); Sun Wook Kim, Gwangju-Si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 360 days.

(21) Appl. No.: 18/279,054

(22) PCT Filed: Feb. 24, 2022

(86) PCT No.: PCT/KR2022/002742

§ 371 (c)(1), (2) Date: Aug. 25, 2023

(87) PCT Pub. No.: WO2022/186551

PCT Pub. Date: Sep. 9, 2022

(65) Prior Publication Data

US 2024/0136190 A1 Apr. 25, 2024
US 2024/0234151 A9 Jul. 11, 2024

(30) Foreign Application Priority Data

Mar. 5, 2021 (KR) ........................ 10-2021-0029614
Feb. 18, 2022 (KR) ........................ 10-2022-0021287

(51) Int. Cl.
*H10P 14/40* (2026.01)
*C23C 14/02* (2006.01)
(Continued)

(52) U.S. Cl.
CPC ............ *H10P 14/40* (2026.01); *C23C 14/024* (2013.01); *C23C 14/042* (2013.01);
(Continued)

(58) Field of Classification Search
CPC ... H01L 21/682; H01L 2224/023–024; H10W 20/057; H10W 20/058;
(Continued)

(56) References Cited

U.S. PATENT DOCUMENTS 5,137,845 A * 8/1992 Lochon .................. H01L 24/11 438/615
7,932,615 B2 * 4/2011 Rinne ..................... H01L 24/02 257/738

FOREIGN PATENT DOCUMENTS

CN 1522471 A 8/2004
JP 2011061183 A 3/2011
(Continued)

OTHER PUBLICATIONS

Written Opinion for PCT/KR2022/002742, mailed Jun. 14, 2022.
International Search Report for PCT/KR2022/002742, mailed Jun. 14, 2022.

*Primary Examiner* — Jose R Diaz
(74) *Attorney, Agent, or Firm* — Renaissance IP Law Group LLP

(57) ABSTRACT

Provided is a method for packing a semiconductor, and more particularly, to a method for packaging a semiconductor, which packages the semiconductor device in a wafer level packaging manner. The method for packaging the semiconductor includes: preparing a wafer including a plurality of semiconductor devices; and forming a conductive pattern layer electrically connected to the plurality of semiconductor devices by using a mask member that is provided separately from the wafer.

9 Claims, 4 Drawing Sheets

(51) Int. Cl.

| | |
|---|---|
| ***C23C 14/04*** | (2006.01) |
| ***C23C 14/16*** | (2006.01) |
| ***C23C 14/34*** | (2006.01) |
| ***C23C 14/56*** | (2006.01) |
| ***H10P 72/50*** | (2026.01) |
| ***H10W 20/49*** | (2026.01) |
| ***H10W 72/29*** | (2026.01) |
| ***H10W 72/90*** | (2026.01) |

(52) U.S. Cl.
CPC ............ *C23C 14/165* (2013.01); *C23C 14/34* (2013.01); *C23C 14/568* (2013.01); *H10P 72/50* (2026.01); *H10P 72/57* (2026.01); *H10W 20/49* (2026.01); *H10W 72/29* (2026.01); *H10W 72/90* (2026.01)

(58) Field of Classification Search
CPC ... H10W 20/021; H10W 70/00; H10W 70/62; H10W 70/6523; H10P 72/57; H10P 72/0461; H10P 72/3411; H10P 72/3412; C23C 14/042; C23C 14/568
See application file for complete search history.

(56) References Cited

FOREIGN PATENT DOCUMENTS

| | | | |
|---|---|---|---|
| KR | 20010061786 | A | 7/2001 |
| KR | 20040085983 | A | 10/2004 |
| KR | 20090131453 | A | 12/2009 |
| KR | 20110133075 | A | 12/2011 |
| KR | 20110134629 | A | 12/2011 |
| KR | 20180069368 | A | 6/2018 |
| KR | 20190114077 | A | 10/2019 |
| TW | I381569 | B | 1/2013 |
| TW | 201532230 | A | 8/2015 |
| TW | 201607017 | A | 2/2016 |

* cited by examiner

SEMICONDUCTOR PACKAGING METHOD

TECHNICAL FIELD

The present disclosure relates to a method for packing a semiconductor, and more particularly, to a method for packaging a semiconductor, which packages the semiconductor device in a wafer level packaging manner.

BACKGROUND ART

A packaging process refers to a process of packaging a semiconductor device to protect the semiconductor device from external environments. In such a packaging process, a process of forming a conductive pattern so as to arrange lines of the semiconductor device so that a signal is received from and transmitted into an external device is involved.

In the existing packaging process, a wafer including a plurality of semiconductor devices is cut along a dicing line to divide the semiconductor device into individual semiconductor devices, and then, a packaging process is performed for each divided individual semiconductor device. The existing packaging process has to be performed into a chip unit, it takes a very long time to package all the semiconductor devices.

Thus, in recent years, a wafer level packaging method for dicing the wafer for each semiconductor device after performing the packaging process first in a state of the wafer including the plurality of semiconductor devices is being used.

In such a wafer level packaging method, a conductive pattern for arranging lines of the semiconductor device is generally formed in a photolithography manner. However, this photolithography manner has a limitation in that it is difficult to effectively reduce a time required for packaging the semiconductor device because of complicated processes, in which a photoresist is applied on the wafer to perform exposing, developing, and etching processes, and then, the photoresist is removed.

RELATED ART DOCUMENT (Patent document 1) KR10-2001-0061786 A

DISCLOSURE OF THE INVENTION

Technical Problem

The present disclosure provides a method for packaging a semiconductor, which is capable of improving productivity of a semiconductor device.

Technical Solution

In accordance with an exemplary embodiment, a method for packaging a semiconductor includes: preparing a wafer including a plurality of semiconductor devices; and forming a conductive pattern layer electrically connected to the plurality of semiconductor devices by using a mask member that is provided separately from the wafer.

The preparing of the wafer may include preparing a wafer, on which a passivation layer is formed, on the wafer comprising the plurality of semiconductor devices.

The forming of the conductive pattern layer may include: disposing the mask member on the wafer; and supplying a conductive material on the wafer to pass through the mask member, thereby depositing the conductive material on the wafer.

The disposing of the mask member may include aligning the mask member on the wafer.

The disposing of the mask member may include disposing the mask member on the wafer so as to be spaced apart from the wafer.

The depositing of the conductive material may be performed by a sputtering process.

The disposing of the mask member and the depositing of the conductive material may be performed in different chambers.

The disposing of the mask member and the depositing of the conductive material may be performed at the same time on different wafers.

The method may further include, after the forming of the conductive pattern layer, cutting the wafer for each semiconductor device.

The mask member may include a shadow mask.

Advantageous Effects

According to the method for packaging the semiconductor in accordance with the exemplary embodiment, the conductive pattern layer may be formed on the wafter including the plurality of semiconductor devices through the single process using the mask member provided separately from the wafer to minimize the number of processes for forming the conductive pattern layer.

Therefore, the time taken to manufacture the semiconductor device may be minimized to minimize the costs of the materials used in the process, thereby improving the productivity of the semiconductor device.

MODE FOR CARRYING OUT THE INVENTION

Figure 1:
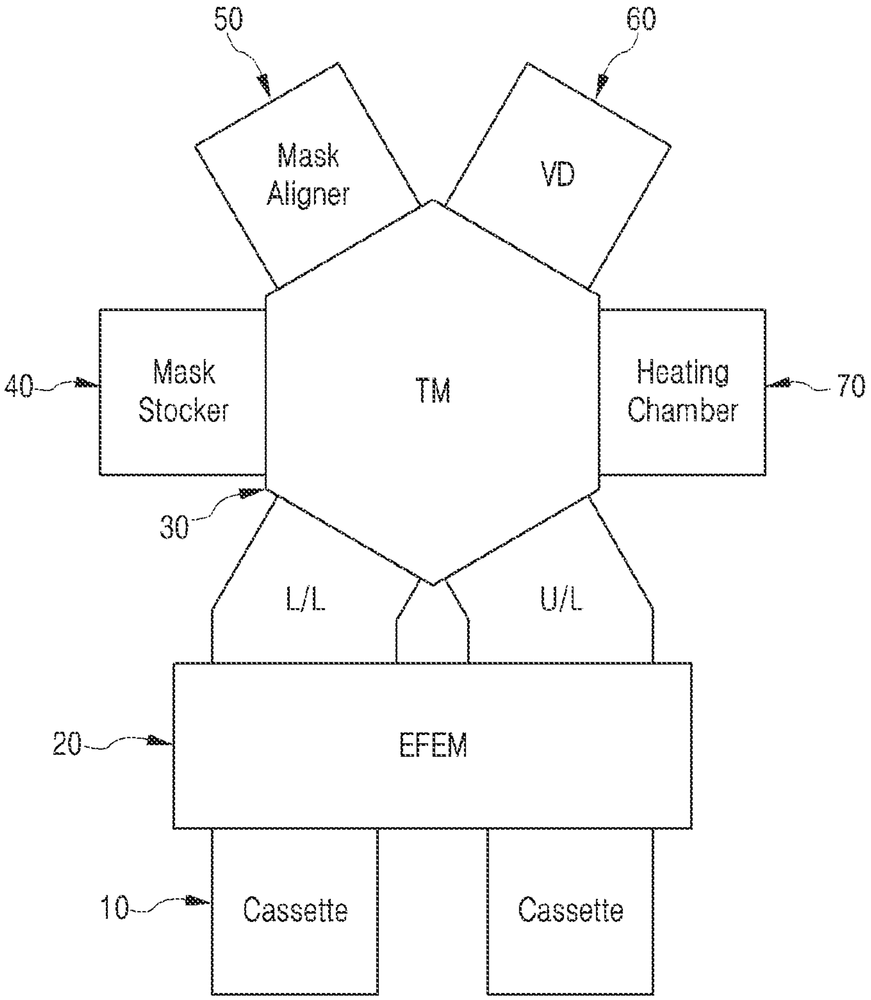
FIG. 1 is a schematic view illustrating a facility for packaging a semiconductor in accordance with an exemplary embodiment.

Hereinafter, exemplary embodiments of the present inventive concept will be described in detail with reference to the accompanying drawings. The present inventive concept may, however, be embodied in different forms and should not be construed as limited to the exemplary embodiments set forth herein. Rather, these embodiments are provided so that the present inventive concept will be thorough and complete, and will fully convey the scope of the present inventive concept to those skilled in the art. In the figures, the dimensions of layers and regions may be exaggerated for clarity of illustration. Like reference numerals refer to like elements throughout.

Figure 2:
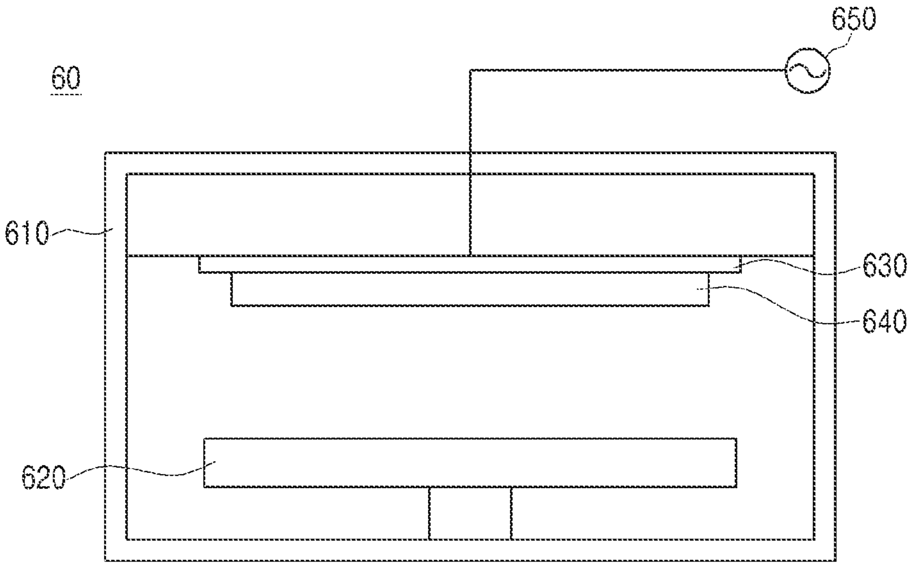
FIG. 2 is a view illustrating a deposition device in accordance with an exemplary embodiment.

FIG. 1 is a schematic view illustrating a facility for packaging a semiconductor in accordance with an exemplary embodiment, and FIG. 2 is a view illustrating a deposition device in accordance with an exemplary embodiment.

Referring to FIGS. 1 and 2, a facility for packaging a semiconductor in accordance with an exemplary embodiment may include a cassette 10, an equipment front end module 20, a transfer module (TM) 30, a mask stocker 40, a mask aligner 50, and a vapor deposition device 60.

The facility for packaging the semiconductor may be classified into a cluster type and an in-line type in accordance with an arrangement of the device. Here, the cluster type refers to a structure in which a plurality of other devices are disposed around one device, for example, the transfer module 30, and the in-line type refers to a structure in which a plurality of devices are sequentially disposed. Hereinafter, a case in which the facility for packaging the semiconductor has the cluster type structure will be described as an example, but the embodiment may also be applied to the facility for packaging the semiconductor having the in-line type structure.

A wafer on which a plurality of unit circuits are disposed is stored in the cassette 10. In this case, a first passivation layer may be further provided on the wafer to cover the plurality of unit circuits. Here, the wafer refers to a form in which the plurality of unit circuits are arranged on one substrate. In this case, each of the unit circuits may refer to a semiconductor device for performing functions such as information conversion, storage, and calculation and a line structure thereof. A plurality of wafers, on which the plurality of semiconductor devices and the first passivation layer are disposed as described above, may be stored in the cassette 10. The cassette 10 may be provided in plurality, i.e., include a cassette 10 for providing the wafter to the equipment front end module 20 and a cassette 10 for receiving the wafer from the equipment front end module 20.

In the facility for manufacturing a semiconductor chip, the wafer is loaded into the cassette 10 and provided to the equipment front end module 20. Although not shown, the wafer provided to the equipment front end module 20 may be transferred to the transfer module 30 through a loadlock chamber.

The wafers stored in the loadlock chamber may be transferred to each of the mask stocker 40, the mask aligner 50, the deposition device 60, and an auxiliary device 70 by the transfer module 30 including a transfer robot for transferring the wafers. Here, the mask stocker 40 may include a mask storage chamber that stores a mask for forming the conductive pattern layer on the wafer, and the mask aligner 50 may include a mask alignment chamber that places the mask withdrawn from the mask storage chamber on the wafer and aligns the mask and the wafer. In addition, the deposition device 60 may include a deposition chamber for forming the conductive pattern layer on the wafer using the mask, and the auxiliary device 70 may include an auxiliary chamber for performing auxiliary functions such as heating the wafer.

Here, the deposition device 60 may include a deposition chamber 610, a support 620, a backing plate 630, and a target 640.

The deposition chamber 610 forms a process space in which a deposition process is performed, and the deposition chamber 610 may be connected to a predetermined vacuum pump (not shown) to maintain a vacuum therein. The deposition chamber 610 may further include a gate valve (not shown) for seating the wafer on the support 620 or unloading the wafer to the outside of the deposition chamber 610 and an exhaust port (not shown) for exhausting a process gases and by-products in the process space.

A gas supply tube (not shown) for supplying an inert gas, for example, an argon (Ar) gas, etc. may be connected to the deposition chamber 610. The gas supply tube may be connected to the deposition chamber 610 to supply the inert gas to a region in which plasma discharge occurs, that is, a region between the target 640 and the wafer.

The support 620 is disposed inside the deposition chamber 610 to support the wafer loaded into the deposition chamber 610. The support 620 may include a heating member such as a heating coil built in to heat the wafer seated thereon. Meanwhile, the support 620 may be installed in the deposition chamber 610 to enable at least one of elevation, rotation, and movement by an elevation device (not shown). For example, the support 620 may be elevated so that the wafer gradually approaches or moves away from the target 640 from an initial position during a sputtering process. The support 620 may allow a substrate S to rotate in a clockwise or counterclockwise direction during the sputtering process or may allow the substrate S to periodically rotate in the clockwise and counterclockwise direction.

The backing plate 630 supports the target 640 and applies a voltage to the target 640. For this, the backing plate 630 may be electrically connected to an external power source 650, for example, a DC power source, an AC power source, or an RF power source to apply plasma power supplied from the external power source 650 to the target 640.

The target 640 is installed in the deposition chamber 610 to face the support 620. In this case, the target 640 may be made of a conductive material for forming the conductive pattern layer on the wafer and may have an area greater than that of the wafer. The target 640 may be installed on a rear surface of the backing plate 630 so as to be spaced a predetermined distance from the wafer and to face each other.

Although not shown, the deposition device 60 may further include a magnetic field forming unit installed inside the deposition chamber 610.

This magnetic field forming unit may vibrate at a certain period (or width) during the sputtering process and also form magnetic fields on a surface of the target 640 while moving in a predetermined direction to uniformly distribute an erosion area of the target 640 on the entire area of the target 640 due to the magnetic fields, thereby maximizing use efficiency of the target 640. In addition, the magnetic field forming unit may form high-density plasma on the surface of the target 640 through the magnetic fields to increase in deposition rate of the conductive pattern layer deposited on the wafer. For this, the magnetic field forming unit may include a magnet module and a magnet moving module.

Hereinafter, a method for manufacturing a semiconductor chip according to an exemplary embodiment will be described in more detail with reference to FIGS. 3 to 9. The method for manufacturing a semiconductor chip according to an exemplary embodiment may be a method for manufacturing the semiconductor chip by the above-described facility for manufacturing the semiconductor chip, and thus, since the above-described contents in relation to the facility for manufacturing the semiconductor chip are applied as it is, duplicated contents will be omitted.

Figure 3:
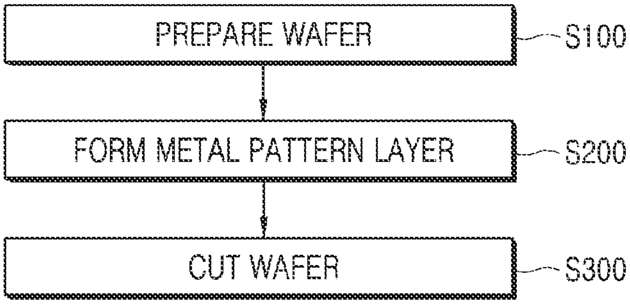
FIG. 3 is a schematic view illustrating a method for packaging a semiconductor in accordance with an exemplary embodiment.

FIG. 3 is a schematic view illustrating a method for packaging a semiconductor in accordance with an exemplary embodiment.

Referring to FIG. 3, a method of manufacturing a semiconductor chip according to an exemplary embodiment includes a process (S100) of preparing a wafer W including a plurality of semiconductor devices D and a process (S200) of forming a conductive pattern layer MP1 or MP2 on the wafer by using a mask member M1 or M2.

Figure 4:
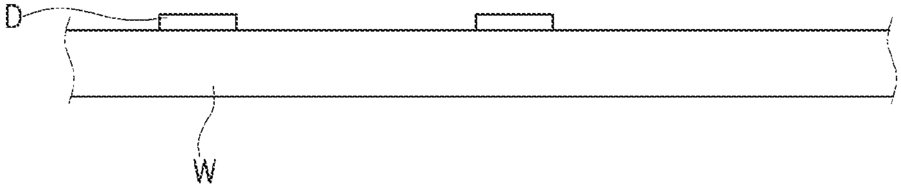
FIGS. 4 to 10 are views illustrating a state of packaging a semiconductor device in stages in accordance with an exemplary embodiment.

In the process (S100) of preparing the wafer W, as illustrated in FIG. 4, the wafer W on which a plurality of semiconductor devices D are formed is prepared. Here, the wafer W refers to a form in which the plurality of unit circuits are arranged on one substrate. In this case, as described above, each of the unit circuits may refer to the semiconductor device D for performing functions such as information conversion, storage, and calculation and a line structure thereof.

Figure 5:
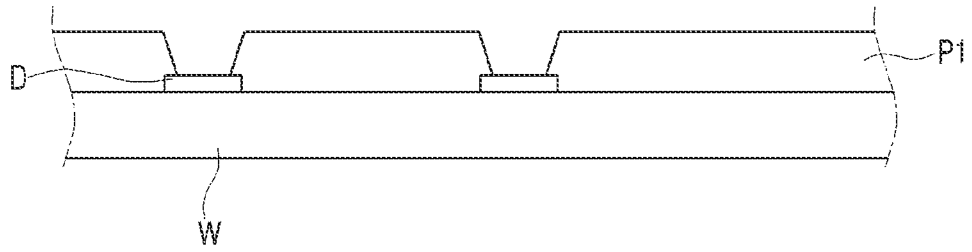

In the process of preparing the wafer W, the wafer W having a first passivation layer P1 formed on the wafer W including the plurality of semiconductor devices D is prepared as illustrated in FIG. 5. Each of the plurality of semiconductor devices D may have input/output pads for electrical connection with an external device. In this case, the first passivation layer P1 is formed on the plurality of semiconductor devices D to expose the input/output pads of each of the semiconductor devices D.

The first passivation layer P1 may be formed by first forming a first passivation film on the wafer W and then patterning the formed first passivation film by a laser drilling or photolithography process or patterning using a mask. At this time, the first passivation layer may be formed of at least one of polyimide (PI), benzo cyclo butene (BCB), poly benz oxazole (PBO), bismaleimidetriazine (BT), phenolic resin, epoxy, silicone, an oxide layer (SiOx), and a nitride layer (SiNx).

In the process (S200) of forming the conductive pattern layer MP1 or MP2, the conductive pattern layer MP1 or MP2 is formed on the wafer W using the mask member M1 or M2. Here, the conductive pattern layer MP1 or MP2 may include a metal pattern layer having conductivity. The mask member M1 or M2 may be made of a metal material or provided in the form of a film using a synthetic resin such as polyimide. Such the mask member M1 or M2 may include a shadow mask provided separately from the wafer W.

The process (S200) of forming the conductive pattern layer MP1 or MP2 may include a process of forming the first conductive pattern layer MP1 on the first passivation layer P1 and a process of forming the second conductive pattern layer MP2 on the second passivation layer P2. In addition, the process of forming the conductive pattern layer MP1 or MP2 may include a process of disposing the mask member M1 or M2 on the wafer W and a process of supplying a conductive material, for example, a metal material to the wafer W to pass through the mask member M1 or M2, thereby depositing the conductive material on the wafer W in the same shape as a pattern of the mask member M1 or M2.

In wafer level packaging in which the packaging process is performed first in the state of the wafer W including the plurality of semiconductor devices D to dice the wafer W into a plurality of semiconductor chips, in the related art, a conductive pattern for arranging lines of the semiconductor devices is formed in a photolithography manner. However, in this photolithography manner, this photolithography manner has a limitation in that it takes a very long time to package the wafer W because of complicated processes, in which a photoresist is applied on the wafer to perform exposing, developing, and etching processes, and then, the photoresist is removed.

As a result, in an exemplary embodiment, the conductive pattern layer may be formed on the wafer, on which the plurality of semiconductor devices are formed, by using the mask member M1 or M2 to minimize the number of processes for forming the conductive pattern layer.

Figure 6:
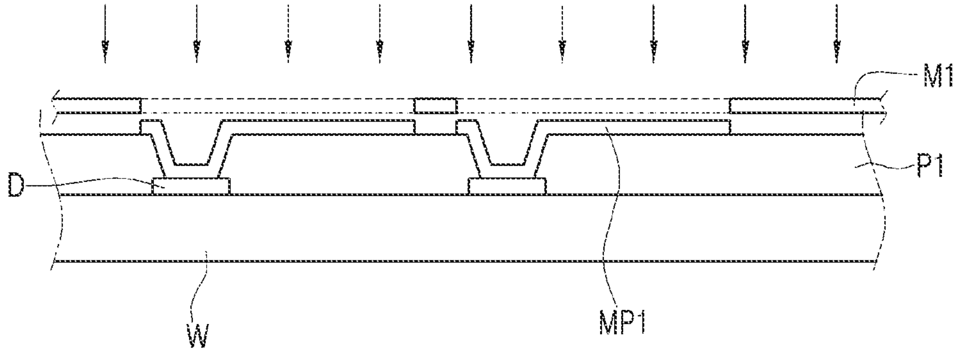

In the process of forming the first conductive pattern layer MP1, as illustrated in FIG. 6, the first conductive pattern layer MP1 is formed on an exposed area formed on the first passivation layer P1. Here, the first conductive pattern layer MP1 serves to redistribute an electrical path of the semiconductor device D. That is, the first conductive pattern layer MP1 redistributes the electrical path of the semiconductor device D to electrically connect the semiconductor chip to an external device regardless of a position of the input/output pad of the semiconductor device D. The above-described first conductive pattern layer MP1 may be made of a metal material having high conductivity such as copper, silver, aluminum, nickel, or the like, or made of an alloy material including other components.

Here, the first mask member M1 may be used to form the first conductive pattern layer MP1. That is, the process of forming the first conductive pattern layer MP1 may include a process of disposing the first mask member M1 on the wafer W, on which the first passivation layer P1 is formed, and a process of supplying a first conductive material onto the wafer W to pass through the first mask member M1, thereby forming the first conductive pattern layer MP1 on the first passivation layer P1 in the same shape as the pattern of the first mask member M1.

In this case, in the process of forming the first conductive pattern layer MP1, the first mask member M1 may be disposed and aligned on the wafer W so as to be spaced apart from the wafer W, and the first conductive material may be supplied onto the wafer W to pass through the first mask member M1, thereby forming the first conductive pattern layer MP1. In this case, the process of disposing the first mask member M1 and the process of depositing the first conductive material may be performed in different chambers. That is, as described above, since the facility for packaging the semiconductor includes the mask aligner and the deposition device, the process of disposing the first mask member M1 and the process of depositing the first conductive material may be performed in different devices, that is, different chambers.

The process of disposing the first mask member M1 and the process of depositing the first conductive material may be performed at the same time on different wafers. That is, since the mask aligner and the deposition device are separately provided in the facility for packaging the semiconductor in accordance with an exemplary embodiment, while the mask member is disposed and aligned on one wafer in the mask aligner, the first conductive material may be deposited on the other wafer in the deposition device.

In this case, a chemical vapor deposition process may be performed to form the first conductive pattern layer MP1, but the process of forming the first conductive pattern layer MP1 may be performed by a sputtering process of depositing particles emitted from a metal target on the first passivation layer P1.

Figure 7:
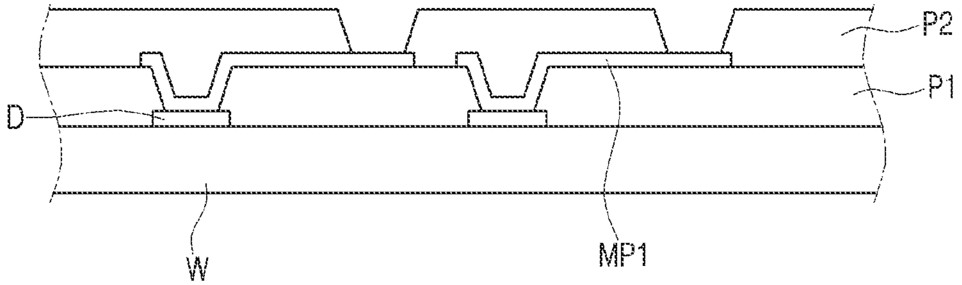

Thereafter, as illustrated in FIG. 7, a process of forming a second passivation layer P2 on the first conductive pattern layer MP1 may be performed.

In the process of forming the second passivation layer P2, a second passivation layer may be formed first on the first conductive pattern layer MP1, and then, the second passivation layer may be patterned by a laser drilling or photolithography process or may be directly patterned using the mask to form the second passivation layer P2. At this time, the second passivation layer P2 may be formed of at least one of polyimide (PI), benzo cyclo butene (BCB), poly benz oxazole (PBO), bismaleimidetriazine (BT), phenolic resin, epoxy, silicone, an oxide layer (SiOx), and a nitride layer (SiNx).

The second passivation layer P2 may be made of a material different from that of the first passivation layer P1. When the first passivation layer P1 and the second passivation layer P2 are formed of materials different from each other, penetrated moisture, etc., may move along a boundary between the layers formed of the materials different from each other to increase in moving distance. Thus, the moisture, etc., may be prevented from being penetrated.

Figure 8:
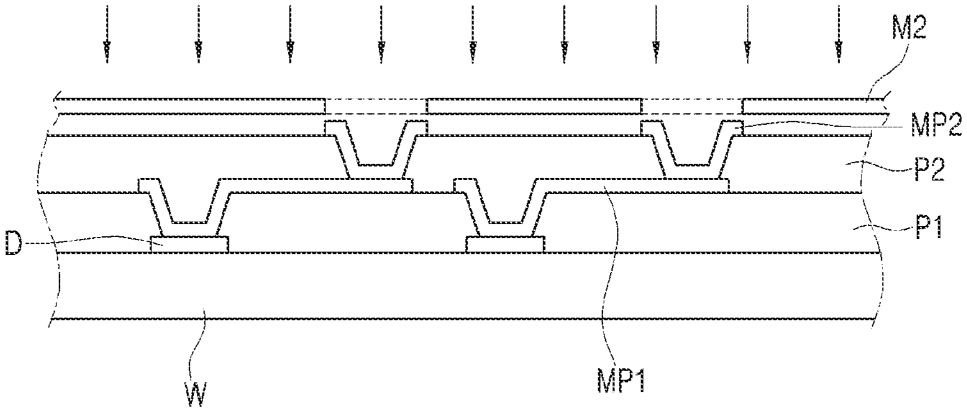

After the second passivation layer P2 is formed, the process of forming the second conductive pattern layer MP2 on the second passivation layer P2 may be performed. In the process of forming the second conductive pattern layer MP2, as illustrated in FIG. 8, the second conductive pattern layer MP2 is formed on an exposed area formed on the second passivation layer P2. Here, the second conductive pattern layer MP2 serves as a seed layer for forming a conductive bumps B. As described above, the second conductive pattern layer MP2 may be made of a metal material such as copper, silver, aluminum, nickel, chromium, titanium, or tungsten, or an alloy material including other components. In addition, the second conductive pattern layer MP2 may be formed by laminating a plurality of layers, and in this case, a plurality of layers made of chromium, a chromium-copper alloy, and a copper material, a plurality of layers made of a titanium-tungsten alloy and a copper material, or a plurality of layers made of aluminum, nickel, and copper materials may be laminated to form the second conductive pattern layer MP2.

Here, the second mask member M2 may be used to form the second conductive pattern layer MP2. That is, the process of forming the second conductive pattern layer MP2 may include a process of disposing the second mask member M2 on the wafer W, on which the second passivation layer P2 is formed, and a process of supplying a second conductive material onto the wafer W to pass through the second mask member M2, thereby forming the second conductive pattern layer MP2 on the second passivation layer P2 in the same shape as the pattern of the second mask member M2.

In this case, in the process of forming the second conductive pattern layer MP2, the second mask member M2 may be disposed and aligned on the wafer W so as to be spaced apart from the wafer W, and the second conductive material may be supplied onto the wafer W to pass through the second mask member M2, thereby forming the second conductive pattern layer MP2. In this case, the process of disposing the second mask member M2 and the process of depositing the second conductive material may be performed in different chambers, and the process of disposing the second mask member M2 and the process of depositing the second conductive material may be performed at the same time in different wafers, like the first conductive pattern layer MP1.

In addition, a chemical vapor deposition process may be performed to form the second conductive pattern layer MP2, but the process of forming the second conductive pattern layer MP2 may be performed by a sputtering process of depositing particles emitted from a metal target on the second passivation layer P2, like the first conductive pattern layer MP1.

Figure 9:
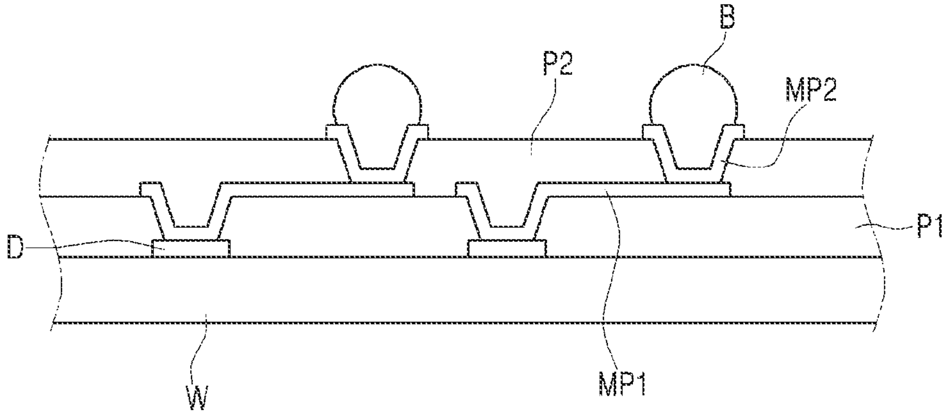

Thereafter, as illustrated in FIG. 9, a process of forming a conductive bump B on the second conductive pattern layer MP2 may be performed.

Here, an electrolytic plating process may be used as a method for forming the conductive bumps B. In addition, the conductive bump B may be formed by directly forming conductive solder on the second conductive pattern layer MP2. In this case, the conductive bump B may be formed on the second conductive pattern layer MP2 based on a ball drop process using a ball drop stencil or a screen printing process.

In an exemplary embodiment, the structure, in which the electrical path of the semiconductor device is redistributed using the first conductive pattern layer MP1 and the second conductive pattern layer MP2 is described as an example, but an additional conductive pattern layer may be formed between the first conductive pattern layer MP1 and the second conductive pattern layer MP2 to redistribute the electrical path of the semiconductor device by the three or more conductive pattern layers.

Figure 10:
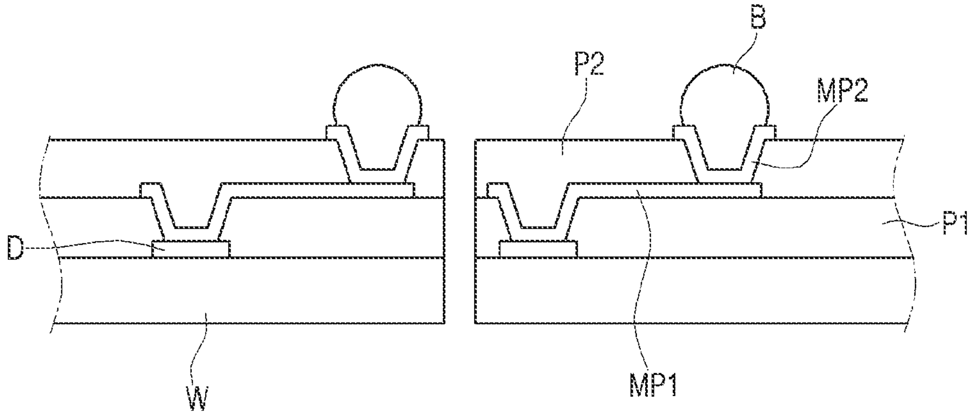

Thereafter, as illustrated in FIG. 10, a process (S300) of cutting the wafer for each semiconductor device may be performed. In the process (S300) of cutting the wafer, a plurality of semiconductor chips including at least one semiconductor device D are formed by cutting the wafer along a dicing line.

As described above, according to the method for packaging the semiconductor in accordance with the exemplary embodiment, the conductive pattern layer may be formed on the wafter including the plurality of semiconductor devices through the single process using the mask member provided separately from the wafer to minimize the number of processes for forming the conductive pattern layer.

Therefore, the time taken to manufacture the semiconductor device may be minimized to minimize the costs of the materials used in the process, thereby improving the productivity of the semiconductor device.

Although the specific embodiments are described and illustrated by using specific terms, the terms are merely examples for clearly explaining the exemplary embodiments, and thus, it is obvious to those skilled in the art that the exemplary embodiments and technical terms can be carried out in other specific forms and changes without changing the technical idea or essential features. Therefore, it should be understood that simple modifications according to the exemplary embodiments of the present inventive concept may belong to the technical spirit of the present inventive concept.

What is claimed is:

1. A method for packaging a semiconductor, the method comprising:
- preparing a wafer comprising a plurality of semiconductor devices; and
- disposing a mask member on the wafer; and
- supplying a conductive material on the wafer to pass through the mask member, thereby directly forming a conductive pattern layer on the wafer by deposition of the conductive material through the mask member in a single film-formation step, wherein the deposited conductive material itself constitutes the conductive pattern layer without a subsequent plating step to form or thicken the conductive pattern layer.

2. The method of claim 1, wherein the preparing of the wafer comprises preparing the wafer, on which a passivation layer is formed, on the plurality of semiconductor devices.

3. The method of claim 1, wherein the disposing of the mask member comprises aligning the mask member on the wafer.

4. The method of claim 1, wherein the disposing of the mask member comprises disposing the mask member on the wafer so as to be spaced apart from the wafer.

5. The method of claim 1, wherein the forming of the conductive pattern layer is performed by a sputtering process.

6. The method of claim 1, wherein the disposing of the mask member and the forming of the conductive pattern layer are performed in different chambers.

7. The method of claim 6, wherein the disposing of the mask member and the forming of the conductive pattern layer are performed at the same time on different wafers.

8. The method of claim 1, further comprising, after the forming of the conductive pattern layer, cutting the wafer for each semiconductor device.

9. The method of claim 1, wherein the mask member comprises a shadow mask.

* * * * *